United States Patent
Matsumoto et al.

(10) Patent No.: US 6,274,014 B1
(45) Date of Patent: Aug. 14, 2001

(54) METHOD FOR FORMING A THIN FILM OF A METAL COMPOUND BY VACUUM DEPOSITION

(75) Inventors: Shigeharu Matsumoto; Kazuo Kikuchi, both of Tokyo (JP)

(73) Assignee: Shincron Co., Ltd. (JP)

( * ) Notice: Subject to any disclaimer, the term of this patent is extended or adjusted under 35 U.S.C. 154(b) by 0 days.

(21) Appl. No.: 09/517,340

(22) Filed: Mar. 2, 2000

Related U.S. Application Data

(62) Division of application No. 09/092,644, filed on Jun. 9, 1998, now Pat. No. 6,103,320.

(30) Foreign Application Priority Data

Mar. 5, 1998 (JP) .................................................... 10-73166
Mar. 30, 1998 (JP) ................................................. 10-101976

(51) Int. Cl.[7] ............................. C23C 14/34; C23C 14/35
(52) U.S. Cl. .................... 204/298.11; 204/298.06; 204/298.14; 204/298.25; 204/298.26; 204/298.17
(58) Field of Search ..................... 204/298.06, 298.07, 204/298.08, 298.11, 298.14, 298.17, 298.25, 298.26; 118/719, 729

(56) References Cited

U.S. PATENT DOCUMENTS

| | | | |
|---|---|---|---|
| 4,431,708 | 2/1984 | Carver et al. | 428/641 |
| 5,234,560 | 8/1993 | Kadlec et al. | 204/192.12 |
| 5,346,600 | 9/1994 | Nieh et al. | 204/192.3 |
| 5,618,388 | 4/1997 | Seeser et al. | 204/192.12 |
| 5,651,867 * | 7/1997 | Kokaku et al. | 204/298.25 |
| 5,820,969 * | 10/1998 | Satoh | 428/141 |
| 5,830,331 * | 11/1998 | Kim et al. | 204/192.15 |

FOREIGN PATENT DOCUMENTS

| | | | |
|---|---|---|---|
| 0042574 | 12/1981 | (EP) | C23C/15/00 |
| 0600303 | 6/1994 | (EP) | H01L/21/3205 |
| 0719874 | 7/1996 | (EP) | C23C/14/08 |
| 56-147829 | 11/1981 | (JP) | C08J/7/04 |
| 56-147830 | 11/1981 | (JP) | C08J/7/06 |
| 7-56001 | 3/1995 | (JP) | G02B/1/11 |
| 8-146358 | 6/1996 | (JP) | G02C/7/02 |
| 8-190002 | 7/1996 | (JP) | G02B/1/10 |
| 8-225932 | 9/1996 | (JP) | C23C/14/30 |
| 9-263937 | 10/1997 | (JP) | C23C/14/34 |

OTHER PUBLICATIONS

Vossen et al., "Thin Film Processes", pp. 131–134, Dec. 1978.*
Hisakazu Nozoye, "High Intensity Radical Beam Source and Thin Film Synthesis", Journal of The Surface Science Society of Japan, vol. 18, No. 12, Dec. 1997.
Hisakazu Nozoye, "Performance Characteristics of an Oxygen Radical Beam Radio–Frequency Source", Journal of the American Vacuum Society, Second Series, vol. 13, No. 5, Sep./Oct. 1995.
Patent Abstracts of Japan, vol. 12, No. 358, Sep. 26, 1988.
J. Vac. Sci. Tech. (15)(5), Sep./Oct. 1997, pp. 2670–2672, Tang et al.

* cited by examiner

Primary Examiner—Nam Nguyen
Assistant Examiner—Steven H. VerSteeg
(74) Attorney, Agent, or Firm—Lorusso & Loud

(57) ABSTRACT

A method for forming a thin film of a metal compound is disclosed. Within a vacuum chamber, a metallic ultra-thin film of a metal or an incompletely-reacted metal is deposited on a substrate. The metallic ultra-thin film is brought in contact with the electrically neutral activated species of a reactive gas so as to convert the metallic ultra-thin film to an ultra-thin film of a metal compound through the reaction of the metallic ultra-thin film with the activated species of the reactive gas. The above-described steps are sequentially repeated so as to deposit on the substrate the ultra-thin film of the metal compound in layers until a thin film of the metal compound having a desired thickness is formed on the substrate.

10 Claims, 9 Drawing Sheets

(B)

water-cooled water-cooled

METHOD FOR FORMING A THIN FILM OF A METAL COMPOUND BY VACUUM DEPOSITION

This application is a division of U.S. Ser. No. 09/092,644 filed Jun. 9, 1998 now U.S. Pat. No. 6,103,320.

BACKGROUND OF THE INVENTION

1. Field of the Invention

The present invention relates to a method for forming a thin film of a metal compound on a substrate through magnetron sputtering or vacuum evaporation in a stable manner and at a high rate of deposition and to a film deposition apparatus for carrying out the same.

2. Description of the Related Art

There has been widely practiced the formation, through sputtering, of thin films of metals or metal compounds, such as oxides, nitrides, fluorides, and the like. In contrast with the formation of thin films of metal, thin films of metal compounds, such as oxides, nitrides, fluorides, and the like are typically formed by one of the following methods:

(1) A reactive gas (e.g. oxygen gas, nitrogen gas, or fluorine gas) is introduced into a chamber equipped with a metal compound target (insulative) or a metal target (conductive), and a thin film is deposited through reactive sputtering activated by a radio-frequency (RF) power source.

(2) A reactive gas is introduced into a chamber equipped with a metal target, and a thin film is deposited through DC (direct current) reactive magnetron sputtering activated by a direct current (DC) power source.

The above two methods involve the following problems. The rate of deposition of a thin film is relatively low, particularly in the case of RF sputtering. The temperature of a substrate rises due to plasma, and thus sputtering at a temperature not higher than 100° C. is difficult, particularly in the case of RF sputtering. In the case of DC reactive magnetron sputtering, arc discharge on a target, particularly on an uneroded portion of the target, causes the material of the target to scatter onto a substrate, and such scattering conceivably causes generation of a defect on a thin film in process of deposition.

In the case of RF magnetron sputtering, charges accumulate in an insulative thin film which is formed on an apparatus component having a grounding potential, a substrate, a substrate holder, or the like, and cause an anomalous discharge. Upon the occurrence of such an arc discharge on a certain component or the like, the material thereof scatters onto a substrate, or upon the occurrence of an arc discharge on a substrate, an arc mark remains on the substrate. Such scattering or an arc mark conceivably causes generation of a defect on a thin film in process of deposition. As the size of a substrate increases, the frequency of this phenomenon increases.

When a metal compound thin film is deposited through sputtering, an incomplete metal compound is apt to be produced due to lack of a component element of the metal compound, such as oxygen, nitrogen, or fluorine. For example, an $SiO_2$ thin film—which is a typical oxide thin film and used as an optical film, an insulating film, a protection film, or a like film—is generally deposited by subjecting an $SiO_2$ target (insulative) to RF magnetron sputtering activated by a radio-frequency power source or by subjecting an Si target (conductive) to DC magnetron sputtering activated by a DC power source. In this case, if the introduction of oxygen gas—which serves as a reactive gas and is introduced concurrently with Ar gas serving as a working gas for sputtering—is insufficient, the composition of a formed thin film will become $SiO_x$ (x<2). In order to prevent this phenomenon, oxygen is introduced into the sputtering atmosphere in a sufficient amount for reaction. However, this causes a reduction in the deposition rate of a thin film to ⅕ to ⅒ the deposition rate of a thin film of metal.

Also, the thus-introduced reactive gas reacts with the target to produce $SiO_2$ on the surface of the target. Charges of positive argon ions and positive oxygen ions in plasma accumulate in the produced $SiO_2$. When the accumulation of the positive charges exceeds the dielectric limit of a $SiO_2$ film, dielectric breakdown occurs. Alternatively, arc discharge occurs on an earth shield (anode), which is a conductive portion of a target, thereby releasing accumulated charges. This is the mechanism of an anomalous discharge occurring on a target. Such an arc discharge involves the following problems.

The material of a target scatters onto a substrate, causing generation of a defect on a thin film in process of deposition.

An arc mark remains on the surface of a target, and $SiO_2$, an insulative substance, accumulates progressively around the arc mark, causing another anomalous discharge.

Also, in the vacuum evaporation method, a thin film of a metal compound is effectively formed through the repetition of the following steps: deposition of a metallic ultra-thin film and conversion of the metal to a metal oxide. In this case, an anomalous discharge may occur on an evaporation source, particularly on the cathode portion of an electron beam source, due to a formed reaction product (insulative substance).

Generally, the rate of deposition through sputtering is ½ to ⅒ the rate of deposition through vapor deposition, in which a deposition material is ion-beam-heated or resistance-heated. Therefore, sputtering is not suited for mass production.

In the method of forming a thin film through sputtering, plasma is generally utilized. Thus, collision of charged particles (ions and electrons) causes the heating of component parts of a film deposition apparatus, a substrate holder, a substrate, etc. As a result, the deposition of a film on a material having poor heat resistance, such as plastic, is difficult. This is particularly so in the case of RF magnetron sputtering which uses a radio-frequency power source.

The above-mentioned problems obstruct the application of sputtering to the formation of a compound thin film.

The applicants of the present invention formerly proposed the following methods for forming a thin film of a metal compound.

(1) A thin film of a metal compound having a desired thickness is formed by repeating the steps of: depositing on a substrate an ultra-thin film of metal, such as titanium or a like metal, through sputtering; and irradiating the ultra-thin film with an ion beam of a reactive gas, such as an oxygen gas or a like gas, so as to convert the ultra-thin film to that of a metal compound, such as titanium oxide or the like (Japanese Patent Publication No. 8-19518).

(2) A thin film of a metal compound having a desired thickness is formed by repeating the steps of: depositing on a substrate an ultra-thin film of metal through sputtering; and irradiating the ultra-thin film with plasma of a reactive gas generated by an inductive plasma source so as to convert the ultra-thin film to that of a metal compound (Japanese Patent Application Laid-Open (kokai) No. 8-176821).

However, the above-mentioned method (1) was found to involve the following problems: an ion gun involves the replacement of a consumed filament; a large number of component members, such as a filament, a screen electrode, and a suppressor electrode, are employed; the employment of a large number of component members causes contamination of a vacuum chamber; an increased screen electrode current requires a power source having a larger current capacity; and a neutralizer involves a temperature rise problem. The method (2) was found to involve the following problem: since a substrate is irradiated with charged particles (Ar ions, reactive gas ions, and electrons) in the plasma form, the charged particles damage the substrate and a thin film in process of deposition on the substrate and cause an increase in substrate temperature.

SUMMARY OF THE INVENTION

An object of the present invention is to provide a method and apparatus for forming a thin film of a metal compound having a predetermined thickness while subjecting a metallic ultra-thin film to oxidation, nitriding, fluorination, or a like reaction, which method and apparatus can prevent any damage to a thin film in process of deposition and can stably form, at a relatively low temperature, a thin film of a metal compound having stable properties.

The above object is achieved by the method and apparatus according to the present invention.

The present invention provides a method for forming a thin film of a metal compound comprising the steps of:

depositing on a substrate within a vacuum chamber a metallic ultra-thin film of a metal or an incompletely-reacted metal; and bringing the metallic ultra-thin film in contact with the electrically neutral activated species of a reactive gas so as to convert the metallic ultra-thin film to an ultra-thin film of a metal compound through the reaction of the metallic ultra-thin film with the activated species of the reactive gas, wherein the steps are sequentially repeated so as to deposit on the substrate the ultra-thin film of the metal compound in a plurality of layers until a thin film of the metal compound having a desired thickness is formed on the substrate.

The present invention further provides a method for forming a thin film of a metal compound comprising the steps of:

depositing on a substrate within a vacuum chamber a metallic ultra-thin film of a metal or an incompletely-reacted metal, an AC voltage ranging between 1 kHz and 100 kHz being applied to a pair of magnetron sputtering targets of the same kind or different kinds insulated electrically from the ground such that the polarity of each of the targets alternates between positive and negative with respect to the ground potential and thus, in an alternating manner, one target serves as a cathode and the other target serves as an anode; and bringing the metallic ultra-thin film in contact with the electrically neutral activated species of a reactive gas so as to convert the metallic ultra-thin film to an ultra-thin film of a metal compound through the reaction of the metallic ultra-thin film with the activated species of the reactive gas, wherein the steps are sequentially repeated so as to deposit on the substrate the ultra-thin film of the metal compound in a plurality of layers until a thin film of the metal compound having a desired thickness is formed on the substrate.

The above-mentioned methods, together with various claimed techniques, yield the effects of the present invention, which will be described later.

The present invention further provides a film deposition apparatus comprising:

a magnetron sputtering device is disposed;

a film deposition process zone for depositing on a substrate a metallic ultra-thin film of a metal or an incompletely-reacted metal through magnetron sputtering;

a reaction process zone for bringing the metallic ultra-thin film in contact with the electrically neutral activated species of a reactive gas so as to convert the metallic ultra-thin film to an ultra-thin film of a metal compound through the reaction of the metallic ultra-thin film with the activated species of the reactive gas;

transfer means for transferring the substrate between the film deposition process zone and the reaction process zone; and shield means for separating the film deposition process zone from the reaction process zone in terms of space and pressure so as to prevent the reactive gas from entering the film deposition process zone;

wherein the substrate is repeatedly transferred a plurality of times between the film deposition process zone and the reaction process zone so as to deposit on the substrate the ultra-thin film of the metal compound in a plurality of layers until a thin film of the metal compound having a desired thickness is formed on the substrate.

Alternatively, in the film deposition process zone, a metallic ultra-thin film of a metal or an incompletely-reacted metal is deposited on a substrate in vacuum evaporation device instead of a magnetron sputtering device.

Further, claimed techniques other than those mentioned above yield the following effects.

According to the present invention, a thin film of a metal compound having stable properties can be formed on a substrate at a high rate of deposition while any damage to a thin film in process of deposition is prevented and the substrate is maintained at a relatively low temperature.

In the present invention, an AC voltage is applied to a pair of targets of the same kind or different kinds insulated electrically from the ground such that the polarity of each of the targets alternates between positive and negative with respect to the ground potential. As a result, magnetron sputtering is performed such that in an alternating manner, one target serves as a cathode (a negative pole) and the other target serves as an anode (a positive pole). This arrangement prevents the unfavorable phenomenon involved in the conventional DC reaction magnetron sputtering method that a target shield serving as an anode, apparatus components, and an apparatus body are covered with a nonconductive or low-conductivity incomplete metal with resultant variations in anode potential.

Specifically, a pair (two) sputtering targets are used for sputtering such that they alternatingly serve as an anode and a cathode through the application of an alternating electric field. A nonconductive or low-conductivity incomplete metal which adheres to a target serving as an anode is removed through sputtering when the target serves as a cathode. Thus, a stable anode potential is always obtained when a target serves as an anode, thereby preventing variations in a plasma potential (normally equal to the anode potential). As a result, a metallic ultra-thin film can be formed stably. The sputtering cathode system employed by the present invention is generally called a dual-cathode system or twin-mag system. Such a sputtering cathode system is reported in, for example, Japanese Patent Applications Laid-Open (kokai) Nos. 4-325680, 5-222531, and 5-311433, and Patent Gazette No. 2574630.

In the step of converting a metallic ultra-thin film of a metal or an incompletely-reacted metal to an ultra-thin film of a metal compound through the reaction of the metallic ultra-thin film with a reactive gas, use of electrically neutral activated species, such as radicals, radicals in an excited state, atoms in an excited state, molecules in an excited state, or the like, is effective.

In addition to the above-mentioned effects yielded by dual-magnetron sputtering, the present invention yields the following effects.

(1) A step of forming a metallic ultra-thin film and a step of converting the metallic ultra-thin film to an ultra-thin film of a metal compound are repeated so as to deposit the ultra-thin film of the metal compound in a plurality of layers. Thus, a thin film having a desired thickness can be formed at a high rate of deposition while the substrate is maintained at a relatively low temperature.

(2) Through the employment of dual-magnetron sputtering for depositing a metallic ultra-thin film, a stable anode potential is obtained; in other words, variations in the anode potential can be prevented, thereby forming a thin film having good quality with satisfactory reproducibility.

(3) Through use of activated species, such as radicals, radicals in an excited state, atoms in an excited state, molecules in an excited state, or the like, in a step of converting a metallic ultra-thin film to an ultra-thin film of a metal compound, potential damage to a thin film in process of deposition can be prevented, and a rise in substrate temperature is suppressed. Thus, a thin film having good properties can be obtained efficiently.

(4) The film deposition process zone and the reaction process zone are separated from each other by shield means, so that the process zones can be independently controlled to respective optimum conditions to thereby form a thin film in a stable manner. Preferably, the pressure of the film deposition process zone is maintained higher than that of the reaction process zone so as to prevent a reactive gas from entering the film deposition process zone.

(5) Even when a reactive gas enters the film deposition process zone with a resultant generation of a reaction product on a target, the reaction product is removed by virtue of dual sputtering. Thus, high-rate sputtering can be performed in a stable manner and with satisfactory reproducibility.

DESCRIPTION OF THE PREFERRED EMBODIMENTS

Figure 1:
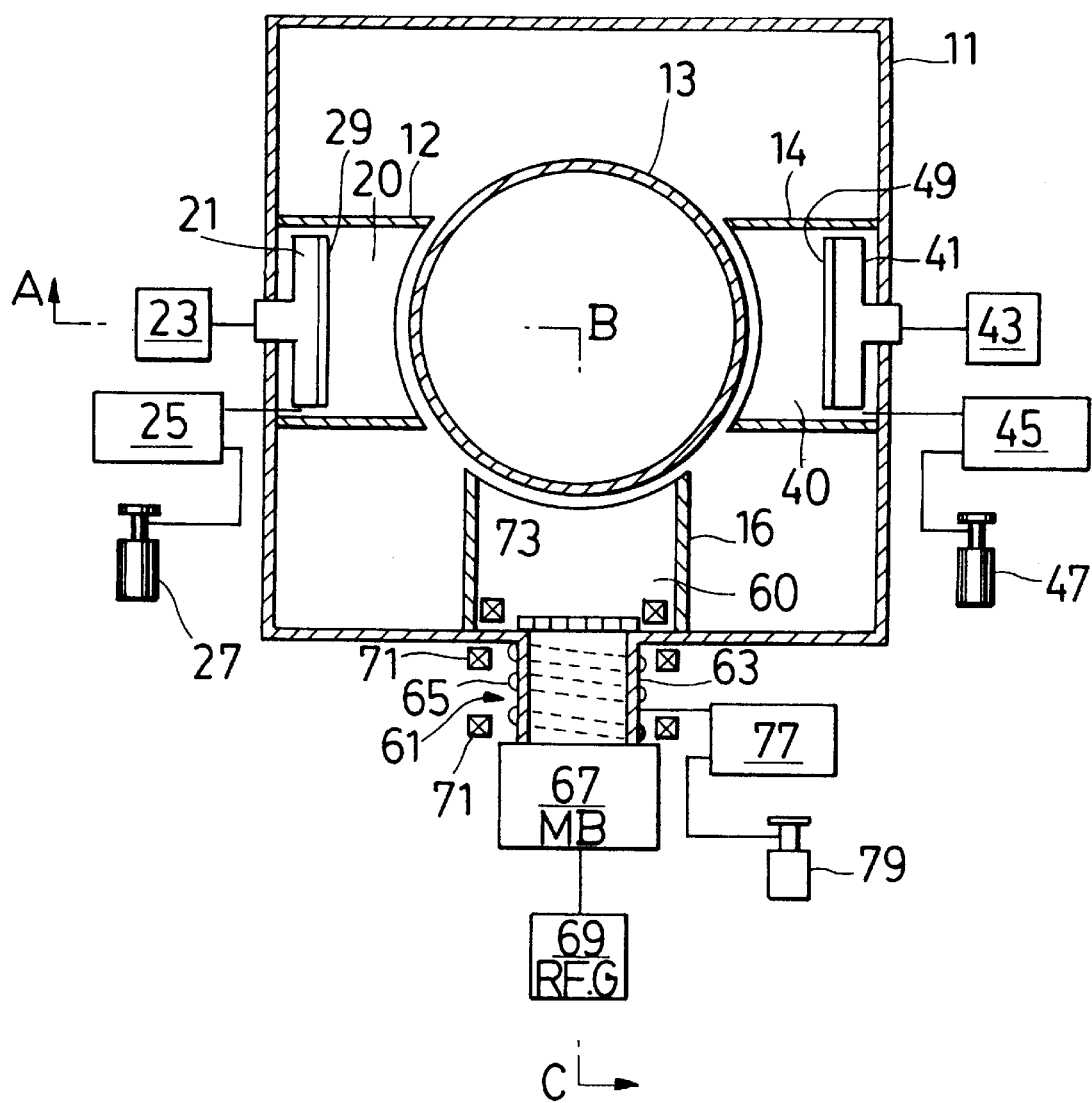
FIG. 1 is a top view showing an embodiment of an apparatus used in the present invention.
Figure 2:
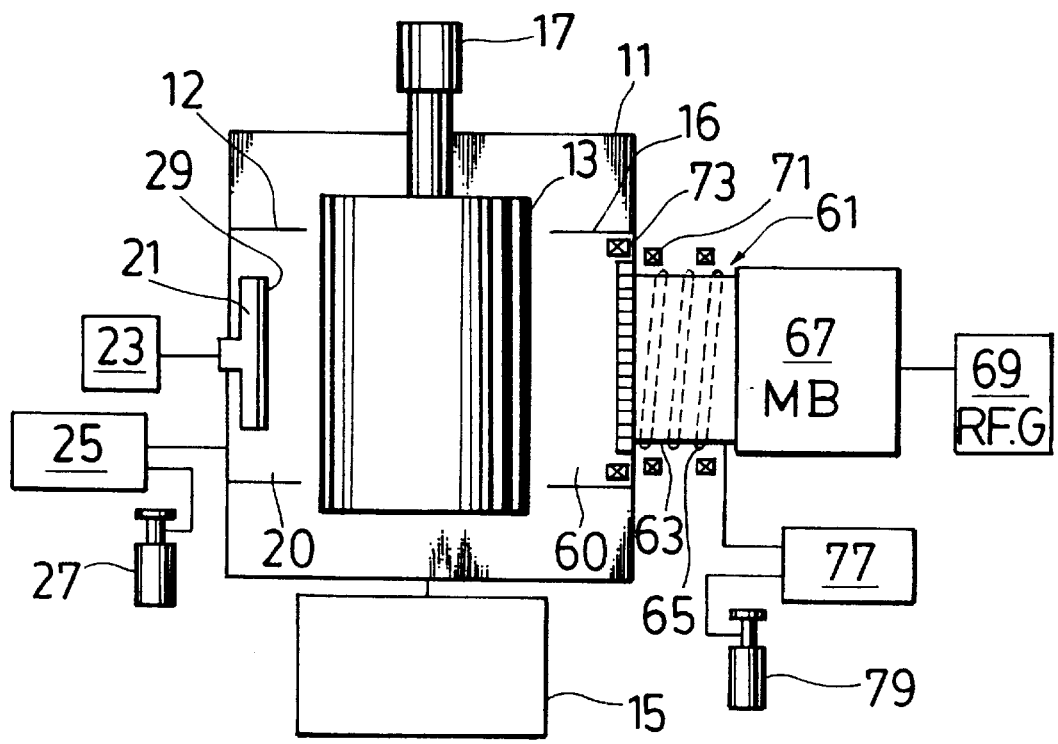
FIG. 2 is a sectional view taken along the line A-B-C of FIG. 1.

FIGS. 1 and 2 illustrates a method and apparatus of for forming a thin film according to the present invention, wherein FIG. 1 is a top view (partially cross-sectioned for better understanding) and FIG. 2 is a side view taken along the line A-B-C of FIG. 1.

Sputtering electrodes 21 and 41, an activated-species generator 61, and a grid 81 are disposed around a substantially cylindrical substrate holder 13 within a vacuum chamber 11.

Film deposition process zones 20 and 40 are located in front of the sputtering electrodes 21 and 41, respectively. FIG. 1 shows a film deposition apparatus equipped with the two sputtering electrodes 21 and 41 for sputtering two different substances.

A reaction process zone 60 is located in front of the activated-species generator 61 and the grid 81.

As the substrate holder 13 is rotated by a motor 17, a metallic ultra-thin film of Si or a like metal is deposited on a substrate (not shown) held on the substrate holder 13 in each of the film deposition process zones 20 and 40, and the metallic ultra-thin film is converted to an ultra-thin film of a metal oxide, such as $SiO_2$ or the like, in the reaction process zone 60. These operations are repeated so as to deposit on the substrate the ultra-thin film of the metal oxide in a plurality of layers until a thin film of $SiO_2$ or the like having a desired thickness is formed.

Herein, the expression "ultra-thin film" is used to discriminate a final thin film from a plurality of ultra-thin films which are deposited to become the final thin film, and denotes that each of the ultra-thin films is substantially thinner than the final thin film.

The thickness of an ultra-thin film is not particularly limited, but is preferably 0.1–20 angstroms or 0.5–10 angstroms.

A film of Si or a like metal can be deposited at a relatively high rate through DC magnetron sputtering. The thus-formed film is converted to a film of a metal compound, such as $SiO_2$ or the like, in the reaction process zone, thereby obtaining a thin film of a metal compound, such as $SiO_2$, $TiO_2$, or the like, at a relatively high rate of production.

The film deposition process zone 20 includes the sputtering electrode 21, a sputtering power source 23, a target 29, a sputtering gas cylinder 27, a mass flow controller 25, and a shield plate (shield means) 12. The film deposition process zone 40 has the same configuration as that of the film deposition process zone 20 and includes a sputtering electrode 41, a sputtering power source 43, a target 49, a sputtering gas cylinder 47, a mass flow controller 45 and a shield plate 14. A sputtering argon gas or the like is introduced into the film deposition process zone 20, which is a space defined by the shield plate within the vacuum chamber 11 and whose degree of vacuum is adjusted by a vacuum pump 15. DC magnetron sputtering is performed in a vacuum atmosphere established in the film deposition process zone 20.

The target 29 is a metallic target of Al, Ti, Zr, Sn, Cr, Ta, Si, Te, Ni—Cr, In—Sn, or the like. Through exposure to the activated species of a reactive gas, films of these metals are converted to optical or insulating films of $Al_2O_3$, $TiO_2$, $ZrO_2$, $Ta_2O_5$, $SiO_2$, and the like, conductive films of ITO and the like, magnetic films of $Fe_2O_3$ and the like, and super-hard films of TiN, CrN, TiC, and the like. Insulative metal compounds such as $TiO_2$, $ZrO_2$, and $SiO_2$ are excessively low in a sputtering rate as compared to metals such as Ti, Zr, and Si and are thus poor in film productivity. The present invention is particularly effective for forming thin films of such insulative metal compounds.

The present invention may also be embodied so as to perform radio-frequency magnetron sputtering through use of the target 29 of $SiO_2$ or the like. The present invention can cope with an incompletely-reacted product, for example, $SiO_x$ (x<2), which is produced through the sputtering of $SiO_2$ in an insufficient presence of oxygen. When such a ultra-thin film of $SiO_x$ is formed, it is converted to a stable ultra-thin film of $SiO_2$ in the subsequent reaction process zone 60. That is, herein, a metallic ultra-thin film includes an ultra-thin film of an incompletely-reacted metal such as $SiO_x$ (x<2) in addition to an ultra-thin film of a metal.

A metallic ultra-thin film is converted to an ultra-thin film of a metal oxide such as $SiO_2$ in the reaction process zone 60.

The reaction process zone 60 includes the activated-species generator 61, the grid 81, and a shield plate (shield means) 14.

Plasma generated through discharge in a reactive gas plasma generation chamber 63 of the activated-species generator 61 is composed of plasma ions, electrons, radicals, radicals in an excited state, atoms in an excited state, molecules in an excited state, etc. According to the present invention, the grid 81 selectively introduces into the reaction process zone 60 the activated species—radicals, radicals in an excited state, atoms in an excited state, and molecules in an excited state—contained in the reactive gas plasma. By contrast, charged particles such as electrons and ions cannot pass through the grid 81 and thus do not enter the reaction process zone 60. Accordingly, in the reaction process zone 60, a metallic ultra-thin film is not exposed to charged particles, but is exposed to only electrically neutral activated species of a reactive gas. As a result, a metal such as Si or the like reacts, through contact, with the activated species to form a metal compound such as $SiO_2$ or the like.

Notably, a "radical" refers to an atom or molecule having at least one unpaired electron. An "excited state" denotes the state in which the energy level is higher as compared to the stationary ground state having the lowest energy.

In a reactive film deposition step in which a metal compound is obtained from a metal or an incompletely-reacted metal, activated species are used for the following reason. For the chemical reaction in the film deposition step, chemically active, electrically neutral, activated species, such as radicals and excited species, are more decisively important than are charged particles, such as ions and electrons. Also, a thin film having target properties can be easily obtained through use of only those particles which, in contrast with charged particles, do not damage a thin film, do not cause an unfavorable rise in substrate temperature, enable a definite separation of a chemical reaction process from a film deposition process so as to perform a composite control on various properties—optical, mechanical, and electrical properties—of a thin film, and contribute significantly to a relevant chemical reaction.

The activated-species generator 61 is also called a radical source and includes the grid 81 and a reactive gas plasma generation unit which, in turn, includes the reactive gas plasma generation chamber 63, an electrode 65 for generating plasma, and a radio-frequency power source 69. A reactive gas such as oxygen gas is introduced into the reactive gas plasma generation chamber 63 from a reactive gas cylinder 79 via a mass flow controller 77. The radio-frequency power source 69 applies, radio-frequency power, via a matching box 67, to the coiled electrode 65 which is wound on the outer circumferential surface of the reactive gas plasma chamber 63 formed of a quartz tube, thereby generating reactive gas plasma within the reactive gas plasma chamber 63.

Examples of a reactive gas include oxidizing gases such as oxygen and ozone, nitriding gases such as nitrogen, carbonating gases such as methane, and fluorinating gases such as $CF_4$.

The reactive gas plasma generation unit is composed of a reactive gas plasma generation chamber and an external or internal electrode; specifically, an inductively-coupled plasma source, a capacitively-coupled plasma source, or an inductively-capacitively-coupled plasma source. These types of plasma sources will next be described in detail.

(1) Plasma source shown in FIGS. 1 and 2: An inductively-coupled plasma source. The coiled electrode 65 is arranged on the atmosphere-side circumferential surface of the reactive gas plasma gas generation chamber 63 which is formed of dielectric such as quartz glass in a cylindrical shape. A radio-frequency power of 100 kHz to 50 MHz is applied to the coiled electrode 65 to thereby generate plasma.

Figure 3:
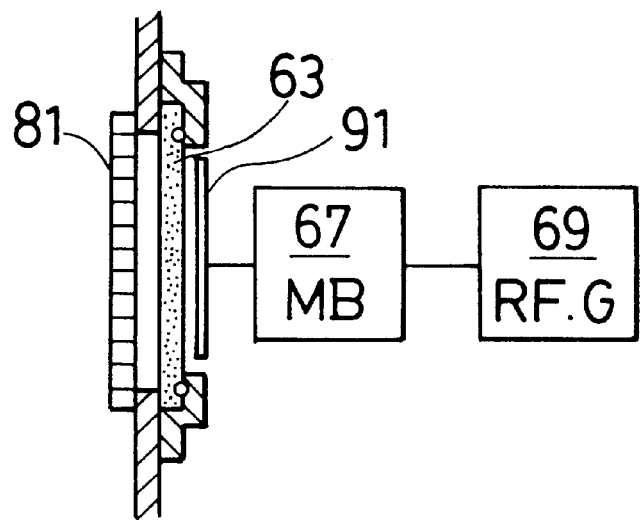
FIG. 3(A) is an explanatory view showing the structure of a plasma source.
FIG. 3(B) is a plan view of the plasma source of FIG. 3(A)
Figure 3:
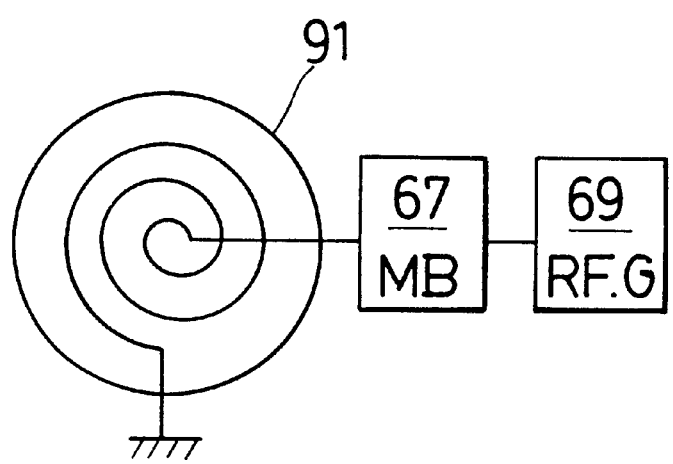

(2) Plasma source shown in FIG. 3: An inductively-coupled plasma sources. A spirally-coiled electrode 91 is arranged on the atmosphere side of the reactive gas plasma generation chamber 63 which is formed of a disk-like dielectric such as quartz glass. A radio-frequency power of 100 kHz to 50 MHz is applied to the spirally-coiled electrode 91 to thereby generate plasma. FIG. 3(B) shows a plan view of the spirally-coiled electrode 91.

Figure 4:
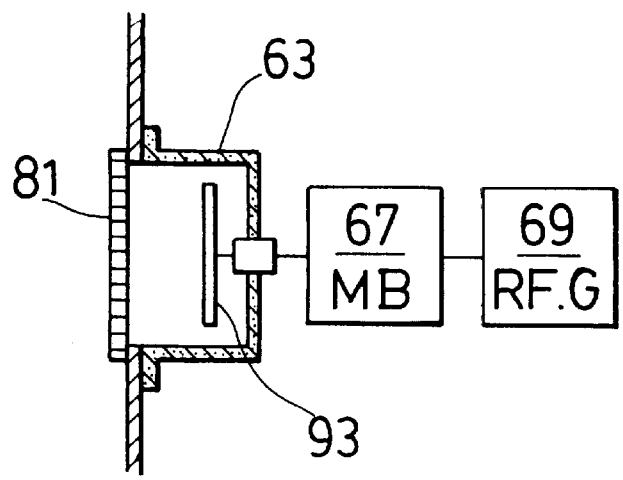
FIG. 4 is an explanatory view showing the structure of a plasma source.

(3) Plasma source shown in FIG. 4: A capacitively-coupled plasma source. A flat-plate-like electrode 93 is disposed within the reactive gas plasma generation chamber 63. A radio-frequency power of 100 kHz to 50 MHz is applied to the flat-plate-like electrode 93 to thereby generate plasma.

Figure 5:
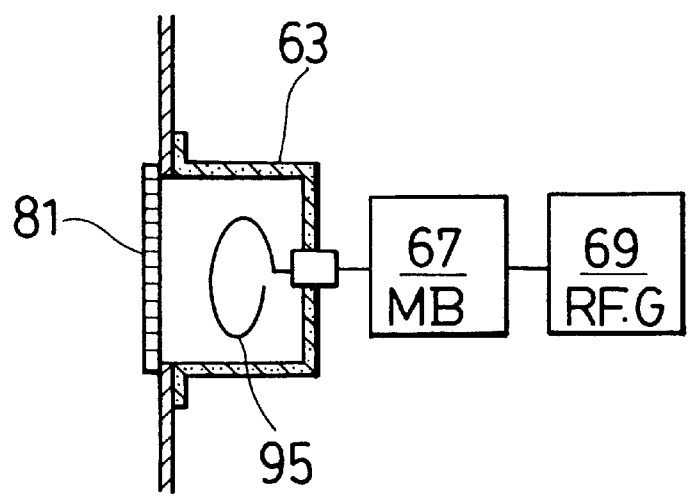
FIG. 5 is an explanatory view showing the structure of a plasma source.

(4) Plasma source shown in FIG. 5: An inductively-capacitively-coupled plasma source. A coiled electrode 95 or a spirally-coiled electrode is disposed within the reactive gas generation chamber 63. A radio-frequency power of 100 kHz to 50 MHz is applied to the coiled electrode 95 or the spirally-coiled electrode to thereby generate the mixture of inductively-coupled plasma and capacitively-coupled plasma.

Also, a helicon-wave plasma source may be embodied through the adjustment of the coil shape or the like, to thereby improve the efficiency of generating activated species in plasma.

Further, as shown in FIGS. 1 and 2, an external magnet 71 and/or an internal magnet 73 is disposed so as to generate a magnetic field of 20–300 gauss in the reactive gas plasma generation unit, to thereby obtain high-density plasma and thus improve the activated-species generation efficiency.

Plasma generated in the reactive gas plasma generation chamber 63 contains charged particles, such as reactive gas ions and electrons, and electrically neutral activated species of a reactive gas, such as radicals, radicals in an excited state, atoms in an excited state, and molecules in an excited state. According to the present invention, only the electrically neutral particles are selectively introduced into the reaction process zone 60 for utilization in reactive conversion of a metallic ultra-thin film to an ultra-thin film of a metal oxide (e.g. Si→SiO$_2$)

To attain the above selective introduction of activated species, there is provided, between the reactive gas plasma generation chamber 63 and the reaction process zone 60, a grid which selectively allows only electrically neutral activated species to pass therethrough and does not allow charged particles to pass therethrough. Ions and electrons in plasma exchange charges on the surface of the grid to thereby be neutralized.

Examples of such a grid include multi-aperture grids and multi-slit grids.

Figure 6:
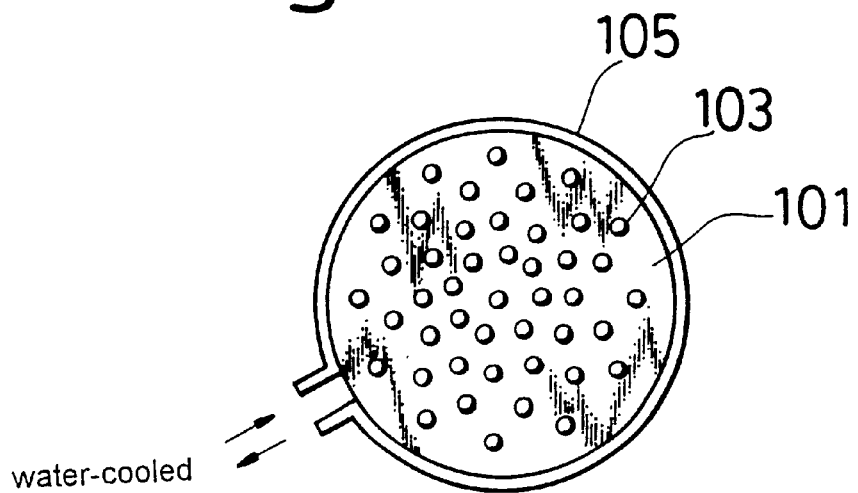
FIG. 6 is a plan view showing a multi-aperture grid.

FIG. 6 is a plan view showing a multi-aperture grid 101. The multi-aperture grid 101 is a flat plate which is formed of a metal or insulating substance and has a number of apertures 103 having a diameter of 0.1–3 mm formed therein.

Figure 7:
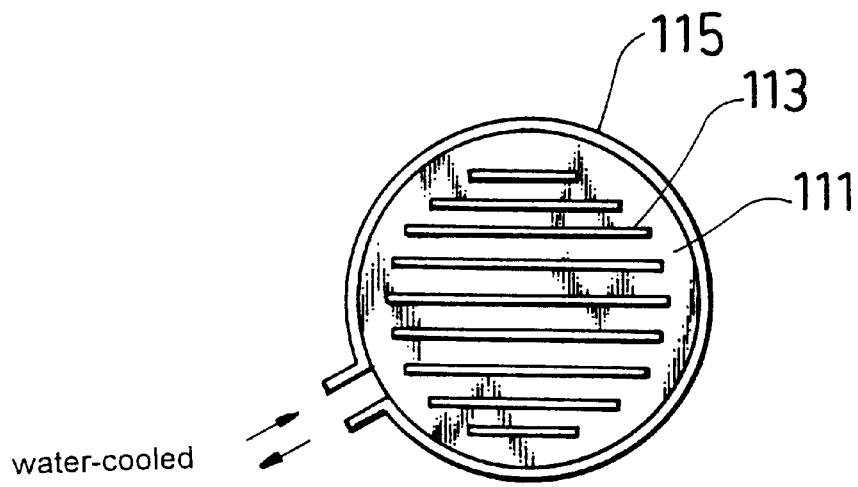
FIG. 7 is a plan view showing a multi-slit grid.

FIG. 7 is a plan view showing a multi-slit grid 111. The multi-slit grid 111 is a flat plate which is formed of a metal or insulating substance and has a number of slits 113 having a width of 0.1–1 mm formed therein.

Preferably, the grids 101 and 111 are cooled by water or the like through use of cooling pipes 105 and 115, respectively, or the like.

The grids 101 and 111 cause ions and electrons in plasma to exchange charges on the surface thereof, thereby introducing electrically neutral, highly reactive activated species into the reaction process zone 60.

Next will be described the shield means (shield plate).

As shown in FIGS. 1 and 2, the shield plates 12, 14, and 16 (shield means) enclose the film deposition process zones 20 and 40 and the reaction process zone 60, respectively, to thereby define independent spaces in a vacuum atmosphere established within the vacuum chamber 11. In other words, there exist, in the large vacuum chamber 11, two kinds of vacuum chambers, i.e. the film deposition process zones 20 and 40 and the reaction process zone 60, which are not completely separated from each other, but are substantially independent of each other and can be controlled independently of each other. As a result, the zones (chambers) can have respective vacuum atmospheres which least influence each other, and thus can establish respectively optimum conditions therein. For example, discharge associated with sputtering and discharge associated with the generation of activated species of a reactive gas can be controlled independently of each other and thus do not influence each other. Accordingly, discharge is performed stably and does not induce any unexpected accident, thereby yielding high reliability. Particularly preferably, the pressure of the film deposition process zones 20 and 40 is made higher than that of the reaction process zone 60. This prevents a reactive gas introduced into the reaction process zone 60 from flowing into the film deposition process zones 20 and 40, thereby preventing an anomalous discharge which would otherwise occur due to a metal compound formed on the surfaces of targets in the film deposition process zones 20 and 40.

The employment of shield plates is particularly effective when a plurality of targets are provided adjacently to each other.

The pressure (degree of vacuum) of the film deposition process zones 20 and 40 is preferably 0.8–10×10$^{-3}$ Torr.

The pressure (degree of vacuum) of the reaction process zone 60 is preferably 0.5–8×10$^{-3}$ Torr.

Typical working conditions are shown below.
(1) Sputtering conditions (Si)
Applied power: 3.6 kW
Substrate temperature: room temperature
Pressure of film deposition process zone:
  2.0×10$^{-3}$ Torr
Rotational speed of substrate holder: 100 rpm
Thickness of ultra-thin film: 2–6 angstroms
(2) Sputtering conditions (Zr)
Applied power: 1.9 kW
Substrate temperature: room temperature
Pressure of film deposition process zone:
  5.0×10$^{-3}$ Torr
Rotational speed of substrate holder: 100 rpm
Thickness of ultra-thin film: 1–4 angstroms
(3) Driving conditions of activated-species generator
Apparatus: inductively-coupled plasma source shown in
  FIGS. 1 and 2
Applied power: 1.9 kW
Pressure: 1.4×10$^{-3}$ Torr In this case, the following practice to actively prevent the occurrence of an anomalous discharge on the surface of a target is very effective in the stable execution of the film deposition process: a voltage to a target is inverted at 1–200 kHz intervals to a voltage ranging between +50 V and +200 V to thereby neutralize, with electrons in plasma, positive charges which accumulate in a compound to be formed on an uneroded portion of the target.

Also, in this case, in order to prevent an increase in the substrate temperature caused by plasma generated in association with a sputtering process, cooling means, such as water-cooling means, is provided for components of a film deposition process zone, for example, shield plates which enclose the film deposition process zone, a target shield, and the like.

Next will be described an example of the formation of a multi-layer antireflection film through use of the apparatus of FIG. 1.

A metal target of Si or a like metal whose oxide has a relatively low refractive index is fixed onto the target 29. A metal target of Ti, Zr, or a like metal whose oxide has a relatively high refractive index is fixed onto the target 49. The target 29 is sputtered to thereby form an ultra-thin film of Si, which is then converted to an ultra-thin film of SiO$_2$ in the reaction process zone 60. The substrate holder 13 is rotated a plurality of times until a thin film of SiO$_2$ having a desired thickness is obtained. Next, the target 49 is sputtered to thereby form an ultra-thin film of Ti or Zr, which is then converted to an ultra-thin film of TiO$_2$ or ZrO$_2$ in the reaction process zone 60. The substrate holder 13 is rotated a plurality of times until a thin film of TiO$_2$ or ZrO$_2$ having a desired thickness is obtained. This operation is repeated so as to obtain a multi-layer antireflection film which is composed of low-refractive-index layers (SiO$_2$) and high-refractive-index layers (TiO$_2$ or ZrO$_2$) arranged in alternating layers.

Figure 8:
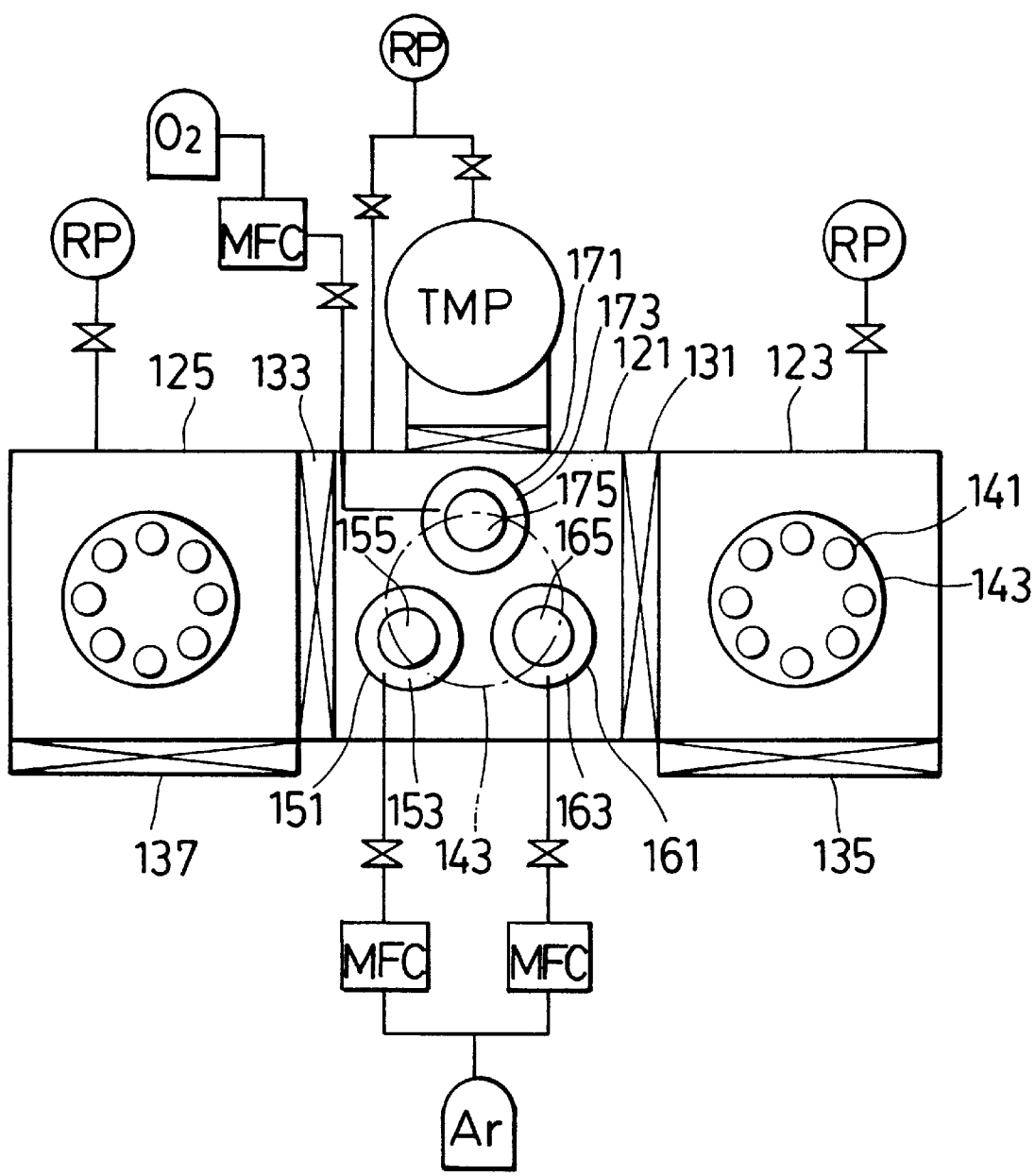
FIG. 8 is a plan view showing another embodiment of an apparatus used in the present invention.

FIG. 8 is a plan view showing another embodiment of the present invention. The apparatus of the present embodiment includes a film deposition chamber 121, a substrate-loading chamber 123 disposed on one side of the film deposition chamber 121, and a substrate-unloading chamber 125 disposed on the other side of the film deposition chamber 121. In FIG. 8, RP denotes a rotary pump, and TMP denotes a turbo molecular pump. The chambers 125, 121, and 123 are connected via gate valves 131 and 133. The substrate-loading chamber 123 can be opened to the atmosphere via a gate valve 135 or a door, and the substrate-unloading chamber 125 can be opened to the atmosphere via a gate valve 137 or a door. That is, the chambers 125, 121, and 123 are isolated from each other in terms of pressure, have respective evacuation systems which are independent of each other, and enables a substrate holder 143 to be transferred through the gate valves 131 and 133.

The substrate holder 143 carrying substrates 141 is loaded into the substrate-loading chamber 123 through the gate valve 135. Then, the substrate-loading chamber 123 is evacuated to vacuum by RP, and the substrates 141 on the substrate holder 143 are subjected to heating or a like pretreatment. Upon completion of the pretreatment, the substrate holder 143 is transferred into the film deposition chamber 121. Thus, the substrate-loading chamber 123 is adapted to carry out the attachment or detachment of the substrate holder 143 and evacuation, and, as needed, to perform pretreatment.

In the film deposition chamber 121, a thin film is formed on each of the substrates 141. To avoid complication, in the illustration of the film deposition chamber 121, only the substrate holder 143 is represented by a dot-and-dash line, and the substrates 141 are not illustrated.

Upon completion of the film deposition process, the substrate holder 143 is transferred into the substrate-unloading chamber 125. The substrates 141 on the substrate holder 143 undergo posttreatment, as needed, and are then unloaded to the exterior of the substrate-unloading chamber 125 through the gate valve 137. Thus, the substrate-unloading chamber 125 is adapted to carry out the attachment or detachment of the substrate holder 143 and evacuation, and, as needed, to perform posttreatment.

A film deposition process in the film deposition chamber 121 is basically similar to that of the apparatus shown in FIGS. 1 and 2 except that the substrate holder 143 has a horizontal plate shape. Targets 155 and 165 are arranged in film deposition process zones 153 and 163, respectively, which are defined by shield plates 151 and 161, respectively. The targets 155 and 165 are sputtered through DC magnetron sputtering so as to form a metallic ultra-thin film on the substrate 141. In FIG. 8, MFC denotes a mass flow controller. As the substrate holder 143 rotates, the substrate 141 enters a reaction process zone 173 enclosed by a shield plate 171. In the reaction process zone 173, the substrate 141 is exposed to electrically neutral activated species, such as radicals, generated by activated-species generator 175, so that the metallic ultra-thin film of, for example, Si, is converted to an ultra-thin film of a metal oxide, for example, $SiO_2$.

Next, further embodiments of the present invention will be described with reference to FIGS. 9 and 10, and FIG. 11. First will be described the embodiment of FIGS. 9 and 10. The present embodiment employs two pairs of magnetron sputtering electrodes (so-called dual-magnetron sputtering).

In the present embodiment, a pair of magnetron sputtering electrodes 21a and 21b, another pair of magnetron sputtering electrodes 41a and 41b, activated-species generator 61, and a grid 81 are disposed around a substantially cylindrical substrate holder 13 within a vacuum chamber 11.

A film deposition process zone 20 is configured in front of the magnetron sputtering electrodes 21a and 21b, and a film deposition process zone 40 is configured in front of the magnetron sputtering electrodes 41a and 41b. In FIG. 9, two pairs of magnetron sputtering electrodes 21a and 21b, and 41a and 41b, are provided so as to sputter two different kinds of substances.

A reaction process zone 60 is configured in front of an activated-species generator 61 and a grid 81.

Si or a like metal is film-deposited at a relatively high rate through dual magnetron sputtering. The thus-formed metallic ultra-thin film is converted to an ultra-thin film of a metal compound, such as $SiO_2$ or the like. Thus, through the magnetron sputtering method using metal targets, a thin film of a metal compound, $SiO_2$, $TiO_2$, or the like, can be obtained.

The film deposition process zone 20 includes a pair of magnetron sputtering electrodes 21a and 21b, a sputtering power source 23, a pair of metal targets 29a and 29b, a sputtering gas cylinder 27, a mass flow controller 25, a shield plate (shield means) 12 (the film deposition process zone 40 has the same configuration as that of the film deposition process zone 20). A sputtering argon gas or the like is introduced into the film deposition process zone 20, which is a space defined by the shield plate within the vacuum chamber 11 and whose degree of vacuum is adjusted by a vacuum pump 15. Dual-magnetron sputtering is performed in a vacuum atmosphere established in the film deposition process zone 20.

Figure 9:
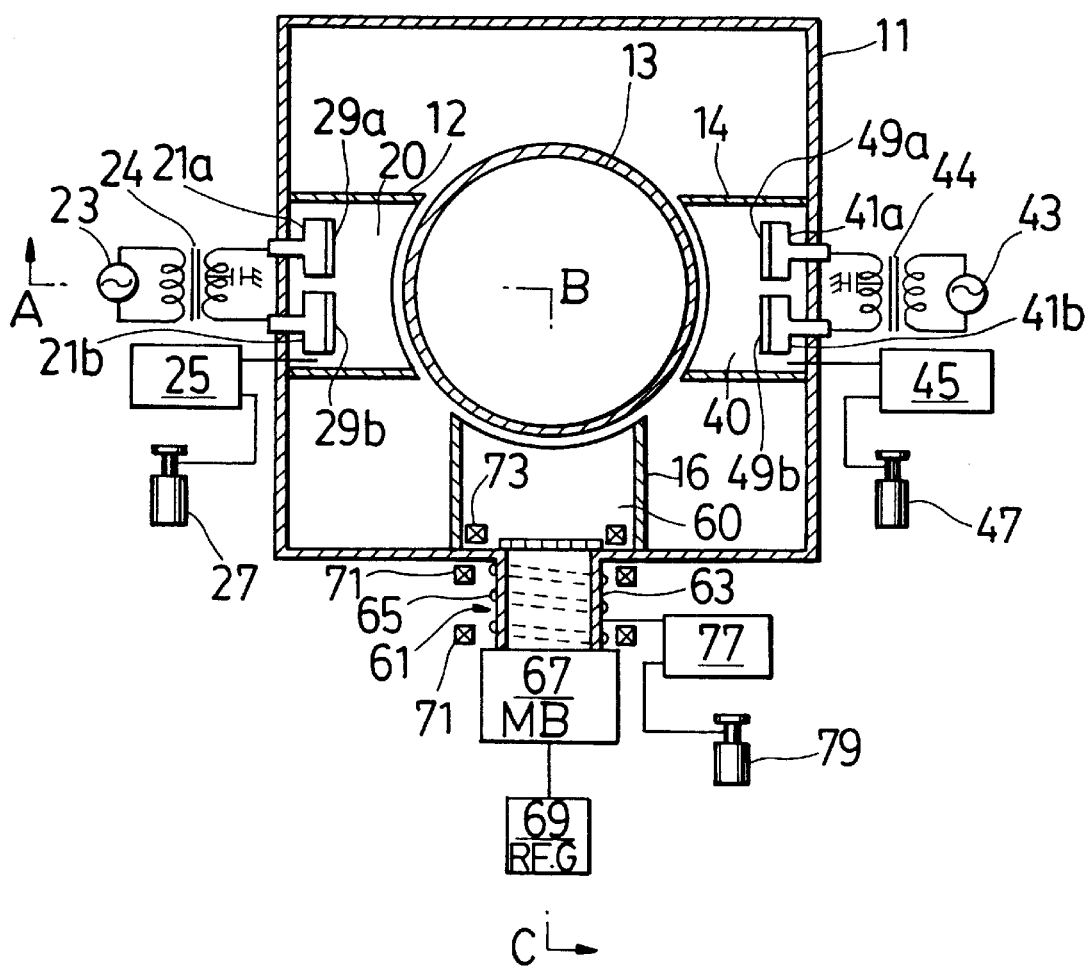
FIG. 9 is a top view showing a still another embodiment of an apparatus used in the present invention.
Figure 10:
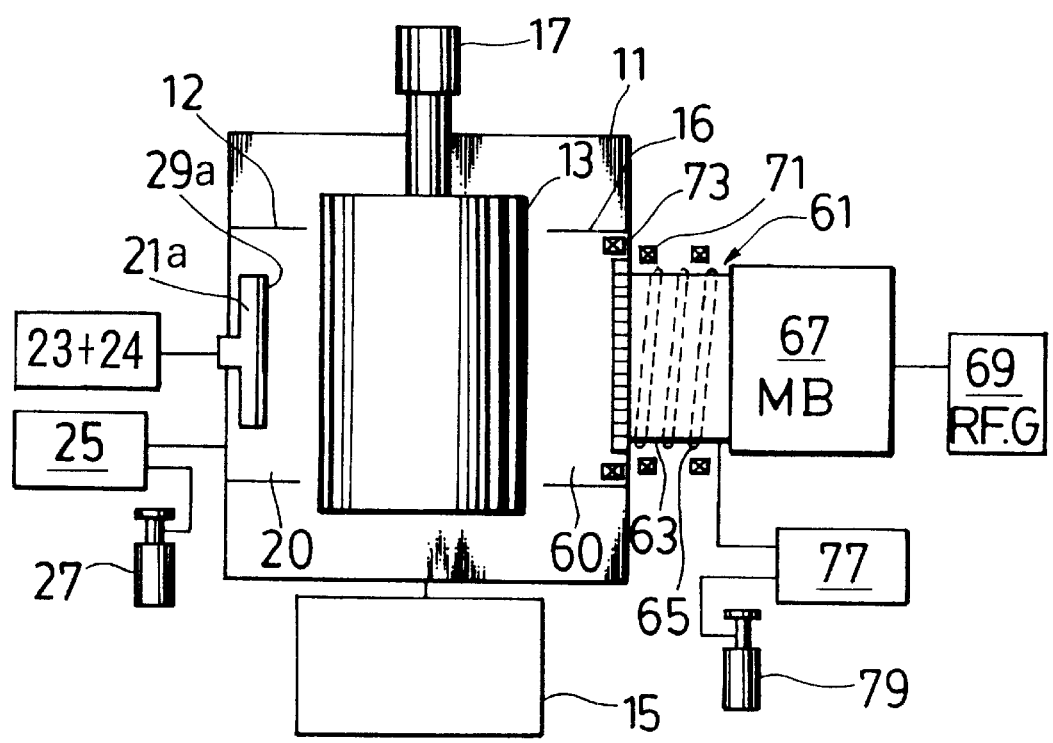
FIG. 10 is a sectional view taken along the line A-B-C of FIG. 9.
Figure 11:
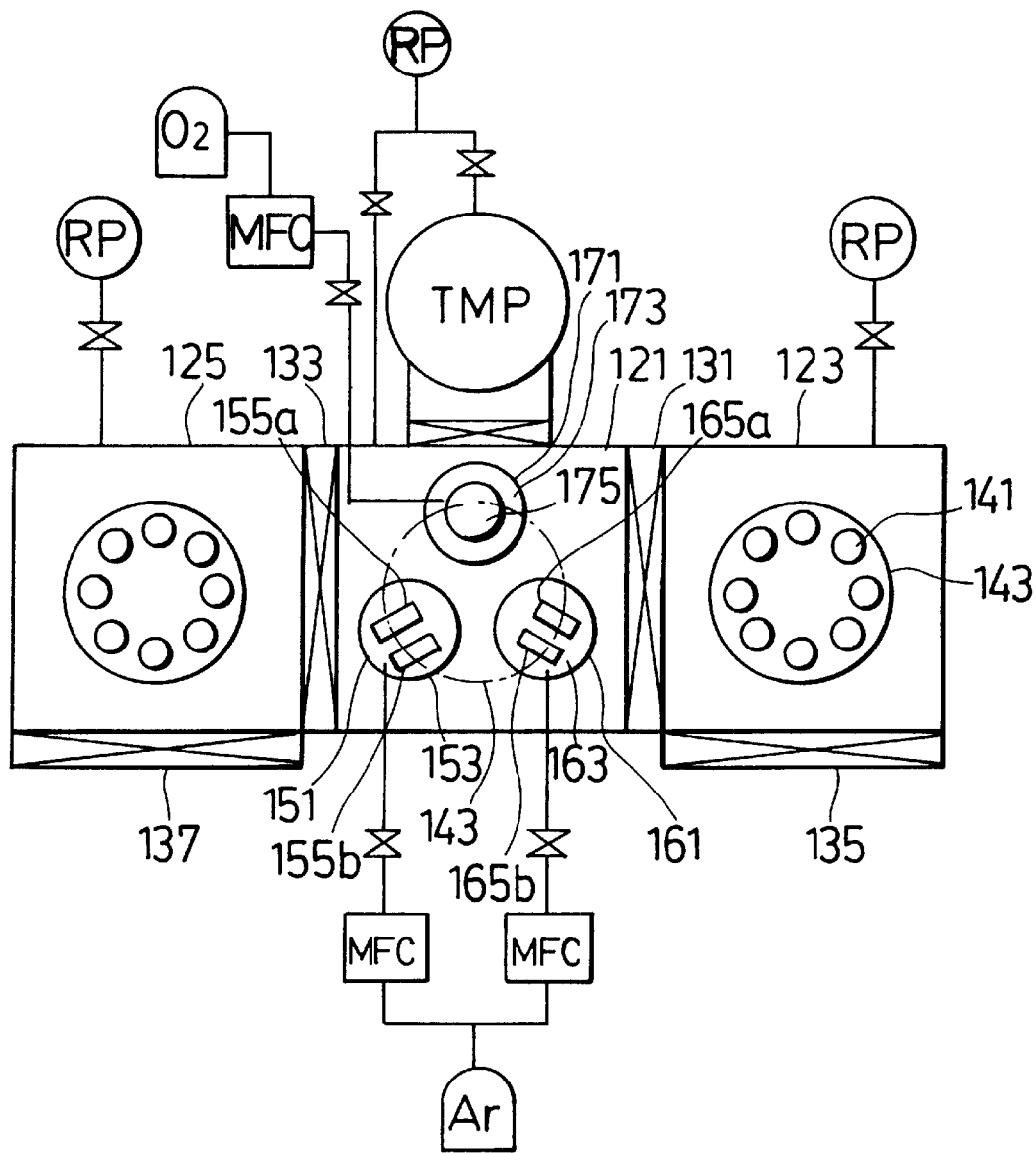
FIG. 11 is a plan view showing a further embodiment of an apparatus used in the present invention.

In the embodiment of FIGS. 9 and 10, through use of at least a pair of (magnetron) sputtering electrodes 21a and 21b and a pair of metallic or conductive sputtering targets 29a and 29b, a metallic ultra-thin film is formed through dual-magnetron sputtering.

Dual-magnetron sputtering employs a pair of sputtering electrodes 21a and 21b and corresponding sputtering targets 29a and 29b, which are electrically insulated from the ground. Accordingly, the sputtering electrodes 21a and 21b and the targets 29a and 29b are mounted on a grounded apparatus body (vacuum chamber 11) via unillustrated insulators. The sputtering electrode 21a and the target 29a are electrically separated from the sputtering electrode 21b and the target 29b. In such an arrangement, a working gas such as argon gas or the like is introduced into the film deposition process zone 20 in such a manner as to adjust a sputtering atmosphere, and a voltage is applied from the AC power source 23 to the sputtering electrodes 21a and 21b via a transformer 24. As a result, an alternating magnetic field is always applied to the targets 29a and 29b. Specifically, at a certain point of time, the target 29a serves as a cathode (negative pole), and the target 29b serves as an anode (positive pole) without fail. At another point of time when the direction of current changes, the target 29b serves a cathode (negative pole), and the target 29a serves as an anode (positive pole). In such a manner, the targets 29a and 29b alternately serve as an anode and a cathode to thereby generate plasma, which causes a target serving as a cathode to be sputtered to form a metallic ultra-thin film on a substrate. At this time, a nonconductive or low-conductivity incomplete metal may adhere to an anode. However, the incomplete metal is sputtered when the anode changes to a cathode by virtue of an alternating electric field; thus, the target surface is restored to the original clean state. Such a cycle is repeated, so that a stable anode potential is always obtained, thereby preventing variations in a plasma potential (normally equal to the anode potential). As a result, a metallic ultra-thin film can be formed stably.

The shield plates 12 and 16 maintain the mutual independence of the film deposition process zone 20 and the reaction process zone 60, respectively. Even when a reactive gas, such as oxygen gas, enters into the film deposition process zone 20 from the reaction process zone 60 and an oxide or the like is temporarily generated on the targets 29a and 29b, a stable anode state is reliably established through dual sputtering effected by an alternating electric field. Thus, the film deposition process is performed with satisfactory reproducibility.

The targets 29a and 29b may be of the same metal or of different metals. When the targets 29a and 29b of the same metal are used, a metallic ultra-thin film of a single metal (e.g. Si) is formed. When the targets 29a and 29b of different metals are used, a metallic ultra-thin film of alloy is formed.

The frequency of an AC voltage applied to the targets 29a and 29b is preferably 1–100 kHz.

Peripheral members of the film deposition process zone 20, such as a target shield (not shown), the shield plate 12, etc., are preferably water-cooled so as to prevent adverse effects, such as an increase in substrate temperature, which would otherwise be induced by heat generation.

As mentioned previously, even when a metal compound is formed on the surfaces of targets in the film deposition process zones 20 and 40 due to an entry of a reactive gas into the film deposition process zones 20 and 40, the metal compound is sputtered when the targets serve as cathodes. Accordingly, a stable anode state is reliably established, so that a stable plasma discharge can be maintained.

Typical working conditions are shown below. The working conditions of the film deposition process zone and the reaction process zone are similar to those of the preceding embodiments.

(1) Sputtering conditions (Si)
Applied power: 2.8 kW
Substrate temperature: room temperature
Pressure of film deposition process zone: $5.0 \times 10^{-3}$ Torr
Frequency of applied AC voltage: 40 kHz
Rotational speed of substrate holder: 100 rpm
Thickness of ultra-thin film: 2–6 angstroms (2) Sputtering conditions (Ta)
Applied power: 1.5 kW
Substrate temperature: room temperature
Pressure of film deposition process zone: $5.0 \times 10^{-3}$ Torr
Frequency of applied AC voltage: 40 kHz
Rotational speed of substrate holder: 100 rpm
Thickness of ultra-thin film: 1–4 angstroms (3) Driving conditions of activated-species generator ($O_2$)
Apparatus: inductively-coupled plasma source shown in FIGS. 1 and 2
Applied power: 2.0 kW
Pressure: $1.4 \times 10^{-3}$ Torr Next will be described an example of the formation of a multi-layer antireflection film through use of the apparatus of FIG. 9.

A metal target of Si or a like metal whose oxide has a relatively low refractive index is fixed onto each of the targets 29a and 29b. A metal target of Ti, Zr, or a like metal whose oxide has a relatively high refractive index is fixed onto each of the targets 49a and 49b. The targets 29a and 29b are dual-magnetron-sputtered to thereby form an ultra-thin film of Si, which is then converted to an ultra-thin film of $SiO_2$ in the reaction process zone 60. The substrate holder 13 is rotated predetermined times so as to deposit the ultra-thin film of $SiO_2$ in layers until a thin film of $SiO_2$ having a desired thickness is obtained. Next, the targets 49a and 49b are dual-magnetron-sputtered, by applying a voltage from the AC power source to the sputtering electrodes 41a and 41b via a transformer 44, to thereby form an ultra-thin film of Ti or Zr, which is then converted to an ultra-thin film of $TiO_2$ or $ZrO_2$ in the reaction process zone 60. The substrate holder 13 is rotated predetermined times so as to deposit the ultra-thin film of $TiO_2$ or $ZrO_2$ in layers until a thin film of $TiO_2$ or $ZrO_2$ having a desired thickness is obtained. This operation is repeated so as to obtain a multi-layer antireflection film which is composed of low-refractive-index layers ($SiO_2$) and high-refractive-index layers ($TiO_2$ or $ZrO_2$) arranged in alternating layers.

Next will be described the embodiment shown in FIG. 11.

A film deposition process in the film deposition chamber 121 is basically similar to that of the apparatus shown in FIGS. 9 and 10 except that the substrate holder 143 has a horizontal plate shape. Targets 155a and 155b and targets 165a and 165b are arranged in film deposition process zones 153 and 163, respectively, which are defined by shield plates 151 and 161, respectively. The targets 155a and 155b and the targets 165a and 165b are sputtered through dual-magnetron sputtering so as to form a metallic ultra-thin film on a substrate 141. In FIG. 11, MFC denotes a mass flow controller. As the substrate holder 143 rotates, the substrate 141 enters a reaction process zone 173 enclosed by a shield plate 171. In the reaction process zone 173, the substrate 141 is exposed to electrically neutral activated species generated by activated-species generator 175, so that the metallic ultra-thin film of, for example, Si, is converted to an ultra-thin film of a metal oxide, for example, $SiO_2$.

What is claimed is:

1. A film deposition apparatus comprising:
   a magnetron sputtering device;
   a film deposition process zone for depositing on a substrate a metallic ultra-thin film of a metal or an incompletely-reacted metal through magnetron sputtering;
   a reaction process zone for bringing the metallic ultra-thin film in contact with an electrically neutral activated species of a reactive gas so as to convert the metallic ultra-thin film to an ultra-thin film of a metal compound through the reaction of the metallic ultra-thin film with the activated species of the reactive gas;
   an activated-species generator for generating the activated species, said activated-species generator comprising a reactive gas plasma generation unit for generating a reactive gas plasma composed of reactive gas ions, electrons, and the electrically neutral activated species through the application of radio-frequency power to a reactive gas introduced thereinto;
   a grid for selectively trapping charged particles, electrons, and ions, from the reactive gas plasma and for selectively allowing the electrically neutral activated species to pass therethrough, to thereby feed the electrically neutral activated species into said reaction process zone;
   transfer means for transferring the substrate between said film deposition process zone and said reaction process zone; and
   shield means for separating said film deposition process zone from said reaction process zone in terms of space and pressure so as to prevent the reactive gas from entering said film deposition process zone;
   wherein the substrate is repeatedly transferred a plurality of times between said film deposition process zone and said reaction process zone so as to deposit on the substrate the ultra-thin film of the metal compound in a plurality of layers until a thin film of the metal compound having a desired thickness is formed on the substrate.

2. A film deposition apparatus according to claim 1, wherein said film deposition process zone contains a pair of targets of the same kind or different kinds insulated electrically from ground and means for applying an AC voltage to said pair of targets such that each of the targets has a polarity which alternates between positive and negative with respect to ground potential, so that in an alternating manner, one target serves as a cathode and the other target serves as an anode, to thereby deposit on the substrate the metallic ultra-thin film of a metal or an incompletely-reacted metal.

3. A film deposition apparatus according to claim 1, wherein the grid is a multi-aperture grid or multi-slit grid.

4. A film deposition apparatus according to claim 1, wherein the reactive gas plasma generation unit of the activated-species generator is an inductively-coupled plasma source which comprises a cylindrical dielectric and a coiled electrode arranged on an exterior circumferential surface of the dielectric and generates plasma through the application of a radio-frequency power of 100 kHz to 50 Khz to the coiled electrode.

5. A film deposition apparatus according to claim 1, wherein the reactive gas plasma generation unit of the activated-species generator is an inductively-coupled plasma source which comprises a disk-shaped dielectric and a spirally-coiled electrode arranged on an exterior surface of the dielectric and generates plasma through the application of a radio-frequency power of 100 kHz to 50 MHz to the spirally-coiled electrode.

6. A film deposition apparatus according to claim 1, wherein the reactive gas plasma generation unit of the activated-species generator is a capacitively-coupled plasma source which comprises an internal flat-plate electrode and generates plasma through the application of a radiofrequency power of 100 kHz to 0 MHz to the flat-plate electrode.

7. A film deposition apparatus according to claim 1, wherein the reactive gas plasma generation unit of the activated-species generator is a plasma source which comprises an internal coiled electrode or an internal spirally-coiled electrode and generates a mixture of inductively-coupled plasma and capacitively-coupled plasma through the application of a radio-frequency power of 100 kHz to 50 MHz to the electrode.

8. A film deposition apparatus according to claim 1, wherein helicon-wave plasma is generated in the reactive gas plasma generation unit in order to improve efficiency of generation of the activated-species by the activated-species generator.

9. A film deposition apparatus according to claim 1, wherein a magnetic field of 20–300 gauss is generated in the reactive gas plasma generation unit in order to improve the activated-species generation efficiency of the activated-species generator.

10. A film deposition apparatus according to claim 1, further comprising a substrate-loading chamber and a substrate-unloading chamber which are disposed on both sides of a film deposition chamber comprising said film deposition process zone and said reaction process zone, said substrate-loading chamber being adapted to carry out the attachment or detachment of a substrate holder and evacuation, and, as needed, to perform pretreatment, said substrate-unloading chamber being adapted to carry out the attachment or detachment of a substrate holder and evacuation, and, as needed, to perform posttreatment, said substrate-loading and substrate-unloading chambers having respective evacuation systems which are isolated from each other in terms of pressure, wherein a substrate is transferred between said substrate-loading chamber and said film deposition chamber and between said film deposition chamber and said substrate-unloading chamber so as to sequentially perform a thin film deposition process.

* * * * *